United States Patent [19]
Lange et al.

[11] Patent Number: 6,165,425
[45] Date of Patent: Dec. 26, 2000

[54] MELTING POT WITH SILICON PROTECTIVE LAYERS, METHOD FOR APPLYING SAID LAYER AND THE USE THEREOF

[75] Inventors: Horst Lange, Bochum; Wolfgang Krumbe, Leichlingen; Heinz Gatzweiler, Erhtstadt, all of Germany

[73] Assignee: Bayer Aktiengesellschaft, Leverkusen, Germany

[21] Appl. No.: 09/355,813

[22] PCT Filed: Jan. 22, 1998

[86] PCT No.: PCT/EP98/00333

§ 371 Date: Aug. 4, 1999

§ 102(e) Date: Aug. 4, 1999

[87] PCT Pub. No.: WO98/35075

PCT Pub. Date: Aug. 13, 1998

[30] Foreign Application Priority Data

Feb. 6, 1997 [DE] Germany ............... 197 04 371

[51] Int. Cl.$^7$ .................................................. B01D 9/00
[52] U.S. Cl. ........................................ 422/243; 422/245.1
[58] Field of Search ............................ 422/243, 245.1, 422/250.1, 254; 264/25, 85, 338; 117/206, 223

[56] References Cited

U.S. PATENT DOCUMENTS 5,431,869  7/1995  Kumar et al. ............................. 264/85

FOREIGN PATENT DOCUMENTS 3536933  4/1987  Germany .

OTHER PUBLICATIONS

Conf. Rec. of 15$^{th}$ Photovolt. Spec. Conference (month unavailable) 1981, pp. 576–580, Saito et al, A New Directional Solidification Technique for Polycrystalline Solar Grade Silicon.

Solar Energy Materials 9, pp. 337–345, (month unavailable) 1983, Saito et al, A Reusable Mold In Directional Solidification for Silicon Solar Cells.

Journal of Crystal Growth 94, (month unavailable) 1989, pp. 62–68, R.S. Ravishankar, Liquid Encapsulated Bridgman (LEB) Method for Directional Solidification of Silicon using calcium Chloride.

Gmelin Handbook of Inorganic and Organometallic Chemistry, Si Silicon vol. B 5d2, p. 214, Author, Raymond C. Sangster, Inorganic Salts (month unavailable) 1995, 8th Edition.

*Primary Examiner*—William Powell
*Attorney, Agent, or Firm*—Joseph C. Gil; Diderico van Eyl

[57] ABSTRACT

The invention relates to melting pots provided with silicon protective layers, a process for applying the silicon protective layer and the use thereof.

9 Claims, No Drawings

MELTING POT WITH SILICON PROTECTIVE LAYERS, METHOD FOR APPLYING SAID LAYER AND THE USE THEREOF

FIELD OF THE INVENTION

The invention relates to melting pots provided with silicon protective layers, a process for applying the silicon protective layer and the use thereof.

BACKGROUND OF THE INVENTION

In the course of processing high-purity silicon for applications in semiconductor technology and photovoltaic applications, dealing with silicon melts plays a central role. For example, single crystals for semiconductor technology and photovoltaic applications are pulled from the silicon melts using the Czochralski method. Furthermore, silicon melts can be processed by crystallization using the Bridgman method or by block casting with subsequent controlled crystallization in an economically favourable way to form block material with an advantageous polycrystalline lattice structure, which is subsequently sawed to form silicon wafers for the production of polycrystalline solar cells. Silicon melts also play an important role in various metallurgical processes which are used for cleaning the silicon, for example bubbling various reactive gases through them or slag extraction methods.

In these processes, the use of materials which withstand the attack by the corrosive hot silicon melts and, at the same time, do not release any unacceptable impurities into the ultrapure melt or the melt which is still to be purified is of essential importance.

Usually, for handling ultrapure silicon melts, quartz-glass or fused-silicon instruments are used. Sometimes, however, shaped ceramic articles made of silicon nitride or ceramic containing silicon nitride are also proposed.

On contact between quartz and liquid silicon, however, a chemical reaction takes place with the formation of SiO gas. Owing to this corrosive attack, not only is the material wetted by the melt gradually dissolved and therefore, in the case of prolonged contact times, destroyed, but also in the case of crystallization of the melt or of melt residues in melting pots or moulds, extensive adhesion and baking occurs between the shaped article and the solid silicon. Because of the different coefficients of thermal expansion of quartz and silicon, thermal stresses are created which regularly lead to cracks, flaws and flaking during the cooling of the crystallized silicon. In the case of silicon blocks resulting from controlled crystallization which are intended to be processed further for photovoltaic applications, this phenomenon leads to significant losses of material. In the extreme case, the thermomechanical stresses may be so great that owing to cracks, flaws or flaking, as well as quartz residues baked solid on the block walls, the entire silicon block becomes unusable.

Also in the case of contact between silicon melts and shaped articles made of silicon nitride or ceramic containing silicon nitride, solid baking between crystallized silicon and the ceramic shaped article occurs.

Baking not only leads to considerable losses in the yield of usable silicon, but also prevents reuse of the melting pots. Furthermore, crystallized silicon blocks which have become baked require considerable outlay in order to obtain material which can be used at all. Reliable prevention of such baking is therefore an important contribution for economic production of finished articles made of crystalline silicon.

In order to avoid contact between the silicon melt and the shaped quartz article, Conf. Rec. of 15th Photovolt. Spec. Conference 1981, pp. 576 et seq. and Solar Energy Materials 9, 337–345 (1983) have proposed coating the quartz articles with silicon nitride powder which exhibits a needle- or whisker-like particle morphology.

It has been found, however, that such coating cannot reliably prevent adhesion between quartz or ceramic components and silicon with the described negative consequences primarily when handling relatively large amounts of melt with prolonged contact times between the melt and the shaped article, over the entire contact area between the liquid silicon and the shaped article. Added to this, there are toxicology problems which allow processing of the silicon nitride whiskers safely, as regards occupational hygiene, only with increased outlay on safety techniques, which increases costs.

Furthermore, J. Crystal Growth 94 (1989) p. 62 has proposed to prevent contact between silicon melts or crystallizing silicon and the melting pot by forming an alkaline earth metal halide melt film between the silicon and the melting pot, and in this way to avoid baking. A disadvantage with this procedure is, however, the corrosion, primarily of quartz crucibles, by the alkaline earth metal halide melt in the case of prolonged contact times between the silicon melt and the melting pot, as are technically indispensable in the case of the crystallization of large-format blocks with block courts in excess of 20 kg. Added to this is the inevitable contribution of impurities by alkaline earth metal in the high-purity silicon. Furthermore, it is unavoidably necessary to use high-purity expensive alkaline earth metal halide in order to avoid undesired contamination of the silicon with impurities from the alkaline earth metal halide. Finally, the overall process is very sensitively contingent on the stability of the alkaline earth metal halide melt film between the silicon and the crucible wall; in the event of tearing or insufficient thickness of the melt film, extensive baking to the extent of destroying the crucible is unavoidable.

One possible way of avoiding these disadvantages is provided in U.S. Pat. No. 5,431,869. In that document, a graphite crucible is firstly coated with a silicon nitride powder and then an alkaline earth metal halide melt film is additionally formed between the silicon nitride powder coating and the silicon melt. This procedure is, however, associated with a disadvantageously higher working outlay and likewise contaminates the silicon melt in an undesirable way with alkaline earth metal and, possibly, with other impurities from the alkaline earth metal halide mixture used. Further to this is the fact that an alkaline earth metal halide melt corrodes silicon nitride (see Gmelin Handbook Si Suppl. Vol. B 5 d2, p.214), so that in the case of prolonged contact times between the alkaline earth metal halide melt and the silicon nitride coating—as are unavoidable in the case of the crystallization of large-format silicon blocks— the protective crucible coating can be broken through. In the event of direct contact between the alkaline earth metal halide melt and the quartz crucible, the risk is run that, besides considerable crucible corrosion, the quartz crucible may devitrify even before the silicon crystallization is completed, and be destroyed in this way. This increases the danger of failure of the crucible with uncontrolled outflow of melt, in the case of which the melting system may become damaged, and the crystallized silicon may become unusable for further processing. Protective films of alkaline earth metal halide melts with quartz crucibles therefore appear unsuitable for the handling of silicon melts.

In the case of using alkaline earth metal halide melt films on graphite crucibles, there is the disadvantage that the formation of the crystallized silicon block is only possible above the melting point of the alkaline earth metal halide used. For the production of large-format silicon blocks, however, this is an elaborate and work-intensive procedure which is liable to problems.

There is therefore a need to provide a coating for components which come into contact with initially liquid and subsequently recrystallizing silicon and which reliably prevents adhesion or baking even during the handling of relatively large amounts of melt and the action of liquid silicon on relatively large component areas over prolonged contact times. The coating should furthermore be straightforward and economical to form and equally readily usable on the materials quartz, ceramic and graphite relevant to silicon metallurgy.

DESCRIPTION OF THE INVENTION

Surprisingly, the object has been achieved with quartz, graphite or ceramic melting pots provided with silicon nitride protective layers, the layers consisting of a silicon nitride powder with powder particles which have an $O_2$ content of from 0.3 to at most 5% by weight and whose length to diameter (l/d) ratio is <10. In a particularly preferred embodiment, silicon nitride powder layers have surprisingly proved particularly reliable, the silicon nitride powder used additionally having a maximum $O_2$ content of 5% by weight, an alkali metal, alkaline earth metal, fluoride, chloride and total carbon content limited to a low value, and an iron-, chromium-, cobalt-, nickel-, tungsten- and titanium-containing particle content limited to a low value.

The term melting pot in the scope of the invention also covers casting and other moulds which are used to produce silicon melts, blocks, rods and wafers.

The invention therefore relates to quartz, graphite or ceramic melting pots provided with silicon nitride protective layers to avoid adhesion between the melting pot and non-ferrous metals following contact of the melting pot with solidifying non-ferrous melts, in which the layers consist of a silicon nitride powder comprising particles and which have an oxygen content of from 0.3 to at most 5% by weight and whose length to diameter ratio is <10. The length to diameter ratio was in this case determined using a scanning electron microscope.

As non-ferrous melts, Si, Al, Ge and/or Ti melts are preferred in this case, these being present either in a mould or as an alloy. Silicon melts are in this case particularly preferred.

In a preferred embodiment of the invention, the melting pots provided with silicon nitride protective layers preferably have oxygen contents of from 0.3 to 2%, very particularly preferably from 0.3 to 1.5%, an alkali metal and alkaline earth metal content of, in each case, at most 1000 ppm, particularly preferably from 1 to 100 ppm, a fluoride content of at most 2000 ppm, particularly preferably from 10 to 1000 ppm, a chloride content of at most 2000 ppm, particularly preferably from 30 to 1000 ppm, a total carbon content of at most 2000 ppm, particularly preferably from 50 to 1500 ppm and an iron, chromium, cobalt, nickel, tungsten and/or titanium content of, in each case, at most 100 particles/g of silicon nitride powder. The number of foreign particles is in this case determined by means of scanning electron micrographs in combination with an element distribution curve. In this case, in particular, particles with a size in excess of 0.05 μm are picked up.

The particles of the silicon nitride layer preferably have a globular or nodular structure.

Preferably, the mean particle size of the silicon nitride particles is at most 50 μm, particularly preferably from 0.6 to 6 μm. In a particularly preferred embodiment of the invention, the silicon nitride powder has an oxygen content of from 0.3 to 1.5% by weight, a mean particle size of from 0.6 to 6 μm, a fluoride and a total carbon content of at most 1000 ppm and a proportion of from 2 to 100%, preferably from 5 to 100%, in the β crystallographic phase.

In another embodiment of the invention, the globular or nodular silicon nitride powder is amorphous.

In this case, the levels of foreign elements are preferably identical to the levels described above for the β crystallographic phase.

Silicon nitride powders with the specification described above are sold by the company H. C. Starck, Goslar, Germany, or can be prepared using the process described in DE-A 3,536,933.

The silicon nitride protective layer on quartz, graphite or ceramic is preferably from 50 to 5000 μm thick.

The invention also relates to a process for applying silicon nitride protective layers to the melting pot, according to which silicon nitride powder is dispersed in a solvent, preferably water or a mixture of water and a hydrophilic organic solvent, and subsequently applied to the substrate by brushing, spraying, squirting, immersion or by electrostatic application of a suspension, a slip or as a powder and is subsequently dried.

In order to improve the adhesion of the layer applied, adhesion promoters, such as organosilanes, silicic acid esters, polyols, polyvinyl alcohols, acrylates and similar compounds may be added to the dispersing agent. Likewise, medium agents such as liquefiers (for example amino alcohols) or thickeners (for example cellulose derivatives) may be added to the dispersion in order to match the Theological behaviour to the chosen coating method.

The way in which the layer is applied and the subsequent drying which may follow, must be such that a homogeneous, uniformly formed layer free of cracks and flakes is created. The drying may take place at room temperature. Temperatures in excess of 100° C., however, are preferred.

After the layer has been dried, if appropriate another heat treatment may take place in order to remove the organic agents. It is generally sufficient for this purpose to heat the coated component briefly in air to 500 to 1000° C., preferably 500 to 700° C. The term briefly is intended in this case to cover the time interval of 2 min and 10 hours. The components coated in this way allow, after contact with liquid and subsequently solidifying silicon, straightforward destruction-free detachment of the crystallized silicon from the component.

The invention also relates to the use of the melting pots provided with silicon nitride protective layers for the production of silicon melts for holding liquid silicon and for crystallizing liquid silicon to form silicon blocks, rods or billets and silicon wafers or silicon granules.

The examples below serve to explain the invention, but without limiting it. All parts and percents are by weight unless otherwise stated.

ILLUSTRATIVE EMBODIMENTS

EXAMPLE 1

From a silicon nitride powder with an oxygen content of 1.3%, a fluoride content of 6 ppm, a chloride content of 800 ppm, a total carbon content of 700 ppm and an iron particle content of 2 particles/g of silicon nitride powder with a β crystallographic phase content of 10%, an aqueous dispersion with a solids content of 30% was produced. After the addition of 0.5% of polyvinyl alcohol, a quartz crucible was coated by spraying with this dispersion. After drying the coating at 150° C. and burning out the organic additives by heating to 900° C. in air, the crucible coated in this way was filled with 100 kg of liquid silicon. After a 3 hour contact time between the coated crucible and the silicon melt, the melt volume was made to crystallize. After cooling to room temperature, the crucible fragments resulting from crystallization of the quartz glass could be removed without difficulty from the walls of the silicon crystallized in block fashion. Baking or adhesion between the crucible and the silicon was not observed over the entire crucible—silicon contact zone. The silicon crystallized in block fashion solidified without cracks and could be used in full, for example for the production of silicon wafers for photovoltaic applications.

EXAMPLE 2 (COMPARISON)

From a silicon nitride powder with an oxygen content of 6%, a fluoride content 2500 ppm, a chloride content of 3000 ppm, a total carbon content of 2700 ppm, an iron particle content of 150 particles/g of silicon nitride powder and a β crystallographic phase content of 80%, an aqueous dispersion was produced—as described in Example 1—and a quartz crucible was coated with it. After filling the quartz crucible with 100 kg of liquid silicon, 3 hours of contact time between the mould and the coated crucible and subsequent crystallization of the melt volume, massive baking between the crucible and the crystallized silicon was observed. On removing the crucible residues from the silicon block, extensive eruptions and flaking took place on the block, this therefore resulting in considerable losses of material. The silicon crystallized in block fashion was also permeated by numerous visible extended cracks and hairline microcracks and was unsuitable for economical further processing (for example for the production of silicon wafers for photovoltaic applications).

EXAMPLE 3

The procedure described in Example 2 was followed; a silicon nitride powder with an oxygen content of 0.8%, a fluoride content below the limit of detection, a chloride content of 110 ppm, a total carbon content of 100 ppm, a mean particle size of 10 μm and an iron particle content below the limit of detection and a β crystallographic phase content of 98% was used. The silicon crystallized in block fashion was able to have the crystallized quartz fragments of the crucible removed without difficulty; cracks in the crystallized silicon, as well as baking on of crucible segments, did not occur. The crystallized suitable was fully suitable for further processing (for example for the production of silicon wafers for photovoltaic applications).

EXAMPLE 4

An amorphous silicon nitride powder with an oxygen content of 0.4, a fluoride content below the limit of detection, a chloride content of 4000 ppm, total carbon content of 300 ppm, a mean particle size of 0.1 μm and an iron particle content below the limit of detection was used to produce a dispersion with 30% solids content in glycol dimethyl ether. 0.5% of polyvinyl alcohol was added to the dispersion as adhesion promoter. The procedure described in Example 1 was then followed. The silicon crystallized in block fashion solidified without cracks and could be used in full (for example for the production of silicon wafers for photovoltaic applications); baking to the crystallized quartz fragments was not observed. The fragments of the quartz crucibles could be detached from the crystallized silicon easily and without difficulty.

What is claimed is:

1. A quartz, graphite or a ceramic melting pot having a silicon nitride protective layer for avoiding adhesion between the melting pot and a non-ferrous metal after the melting pot contacts a solidifying non-ferrous melt, the melting pot comprising:

(a) a quartz, graphite, or a ceramic substrate,
    (b) a silicon nitride protective layer on the substrate, wherein the protective layer comprises silicon nitride powder consisting of powder particles which have an oxygen content ranging from about 0.3 to at most 5% by weight, and a length (l) to diameter (d) ratio that is less than 10.

2. The melting pot of claim 1, wherein the silicon nitride powder has an alkali metal and alkaline earth metal content of at most 1000 ppm, a fluoride content of at most 2000 ppm, a chloride content of at most 2000 ppm, a total carbon content of at most 2000 ppm and a component comprising a member selected from the group consisting of iron, chromium, cobalt, nickel, tungsten and titanium at a content of at most, 100 particles/g of silicon nitride powder.

3. The melting pot of claim 1, wherein the silicon nitride powder has a mean particle size that is at most 50 μm.

4. The melting pot of claim 1, wherein from 2 to 100% of the silicon nitride powder comprises a β crystallographic phase.

5. The melting pot of claim 1, wherein the silicon nitride powder is amorphous.

6. A process for the production of silicon melts comprising melting silicon in a quartz, graphite, or a ceramic melting pot according to claim 1.

7. A process for holding liquid silicon comprising holding a silicon melt in a quartz, graphite or a ceramic pot according to claim 1.

8. A process for crystallizing liquid silicon to form silicon blocks, rods or billets and silicon wafers or silicon granules comprising melting silicon in a quartz, graphite or ceramic melting pot according to claim 1 and crystallizing the liquid silicon.

9. Process for applying silicon nitride protective layers according to claim 1, wherein silicon nitride powder is dispersed in a solvent and subsequently applied to the substrate by brushing, spraying, squirting, immersion or by electrostatic application of a suspension, a slip or as a powder and is subsequently dried.

* * * * *